United States Patent [19]

Timm

[11] 4,174,539
[45] Nov. 13, 1979

[54] MAGNETIC BUBBLE MEMORY DETECTOR-AMPLIFIER

[75] Inventor: Walter C. Timm, Edina, Minn.

[73] Assignee: Control Data Corporation, Minneapolis, Minn.

[21] Appl. No.: 956,769

[22] Filed: Nov. 1, 1978

[51] Int. Cl.² ............................................. G11C 19/08
[52] U.S. Cl. ......................................................... 365/8
[58] Field of Search .................................... 365/7, 8, 9

[56] References Cited

U.S. PATENT DOCUMENTS

| 3,813,660 | 5/1974 | Buhrer | 365/8 |
| 3,953,840 | 4/1976 | Cutler et al. | 365/7 |

*Primary Examiner*—James W. Moffitt

*Attorney, Agent, or Firm*—William J. McGinnis, Jr.

[57] ABSTRACT

A magnetic bubble memory detector-amplifier for use with a bubble memory device having the dual output from an active and a dummy bubble detector in combination consists of a differential amplifier associated with constant current sources to drive the bubble detector elements, a notch filter coupled to the output of the differential amplifier to eliminate the rotating magnetic field frequency component, an amplifier coupled to the output of the filter which is controlled by a bias pulse at the fundamental frequency of operation to provide a reference for better discrimination between "ones" and "zeros," and, finally, a self-biasing detector coupled with a strobed output flip-flop.

4 Claims, 2 Drawing Figures

MAGNETIC BUBBLE MEMORY DETECTOR-AMPLIFIER

BACKGROUND OF THE INVENTION

This invention relates to the detection or sensing devices used with bubble memory devices. In order to amplify the output of such devices and discriminate between the binary "ones" and "zeros" in the output data stream.

Magnetic bubbles in most magnetic bubble memory systems are detected by a magnetoresistive element placed in the magnetic bubble path on the actual bubble chip. This element changes conductivity slightly in the presence of a bubble in the output from the storage area. This change in conductivity is sensed by passing a continuous current through the detector element and amplifying the resulting voltage change from the change in conductivity. However, the rotating magnetic field that propagates the bubbles on the chip induces a significant voltage in this detector element which may be orders of magnitude greater than the detected bubble signal. To reduce this induction effect, a dummy detector is placed on the bubble chip where it is subjected to the same rotating magnetic field. The two detector elements produce two signals which are supplied to a differential amplifier in such a way that the rotating magnetic field signal common to both the active and dummy detector is cancelled, leaving only signals resulting from actual magnetic bubbles. The dummy detector never receives an input bubble, whereas the active detector element receives the stream of bubbles from the storage area of the memory element.

In addition to the presence of any possible residual output resulting from the rotating magnetic field, there are numerous other sources of noise present in the conventional bubble memory systems which make it comparatively difficult to accurately detect the passing of a magnetic bubble in the device. This invention proposes a detector-amplifier which meets the various problems encountered and produces a reliable strong output signal which accurately reflects the passing of magnetic bubbles in the memory device.

U.S. Pat. No. 3,838,406 shows one type of active-dummy detector used with bubble memory devices. However, the output from such a detector is shown as being processed by only a conventional differential amplifier.

U.S. Pat. No. 3,813,660 shows the use of a strobe pulse used in connection with discriminating between the "ones" and "zeros" in the output of a bubble memory chip by causing activation of the output at only the appropriate time when a relevant signal would be present. However, this patent shows that system used in connection with a radio frequency excited detection system considerably different from the present detection system which is based on direct current sensing of the bubble chip output.

SUMMARY OF THE INVENTION

The present invention is a system for detecting the presence of "ones" and "zeros" in the output data stream of a bubble memory chip. The bubble memory chip is provided with any one of a number of suitable dual element detector types where one element is active and the other is a dummy used to balance the in plane rotating magnetic field used with bubble chips. These detector elements are driven by constant current sources so that a differential amplifier connected to the output will detect voltage pulses as a magnetic bubble passes the sensing element.

The output of the differential amplifier is coupled to a filter of the so-called "notch" type which removes or nulls only a narrow band of the frequency spectrum. In this particular case the notch filter is tuned so that the frequencies nulled, or not transmitted in the system, are those frequencies common to the frequency of the rotating in plane magnetic field. The output of the filter is coupled to an amplifier responsive to a bias pulse at the fundamental frequency of the bubble chip output so that the amplifier is active only at times when a relevant output signal would be detected on the bubble memory device. The width and amplitude of this bias pulse are adjusted appropriately.

The output of the amplifier is coupled to a self-biasing detector which produces an output pulse in the presence of an input pulse indicating the presence of a magnetic bubble. The output from the detector is coupled through a strobed flip-flop as the final output of the present invention. The strobe frequency for the output of the flip-flop is such that the flip-flop is only operative at the appropriate time for transmission of a magnetic bubble if present in the detecting element on the bubble memory chip.

IN THE FIGURES

DESCRIPTION OF THE PREFERRED EMBODIMENT

Figure 1:
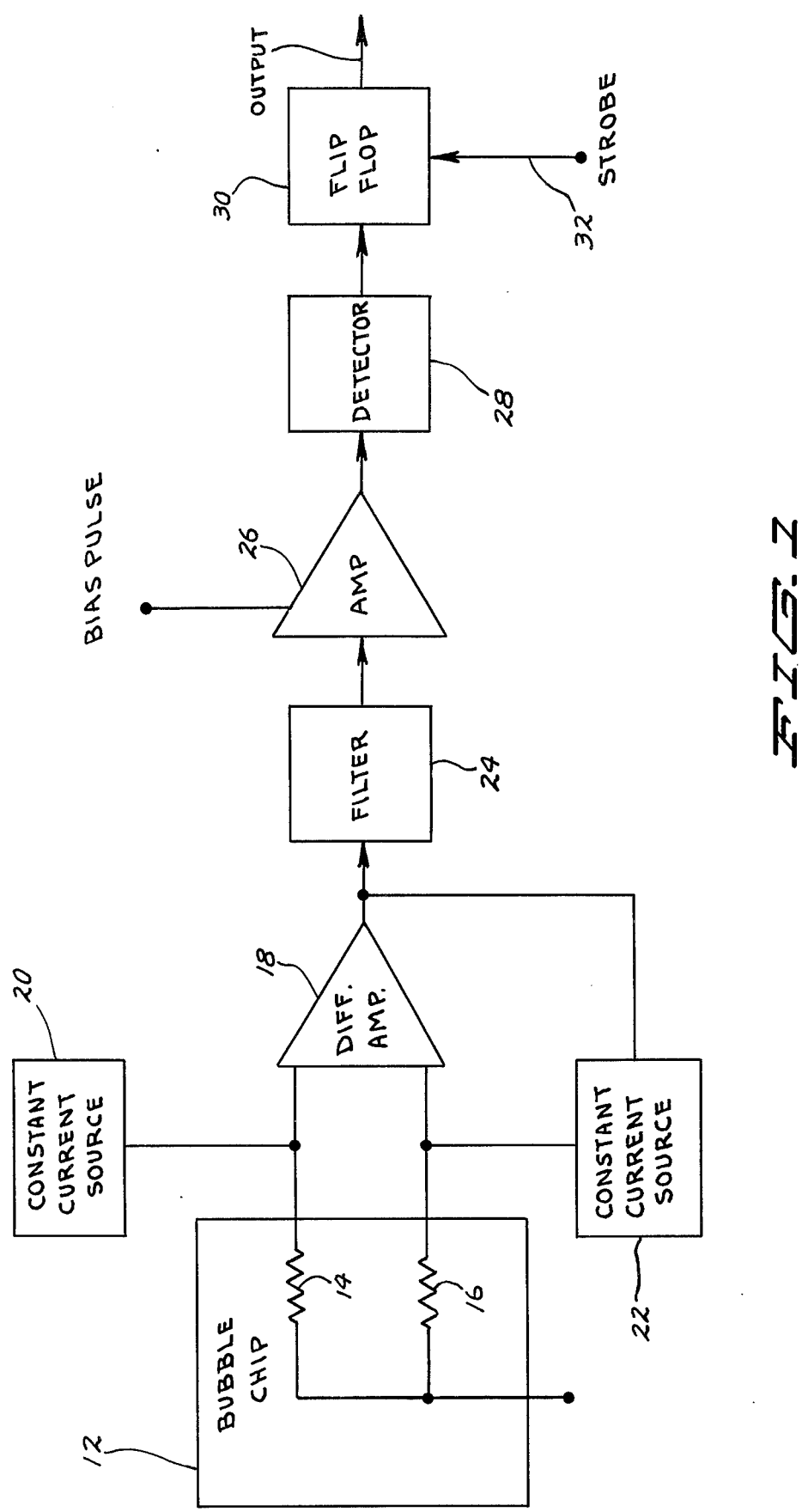
FIG. 1 is a block diagram of a device according to the present invention.

Referring now to FIG. 1, the detector-amplifier 10 according to the present invention is shown. A bubble memory chip 12 having any particular design which results in an output containing a stream magnetic bubbles may be employed with this invention but the bubble chip itself is not a part thereof. The bubble chip may contain a pair of bubble detectors shown schematically at 14 and 16 using the same symbol as is used for a resistor to indicate the magnetoresistive nature of such detectors. Element 14 is the so-called "active" detector which is used to provide the input signal used for the detector-amplifier. Element 16 is a so-called "dummy" detector which receives no input bubble stream at all but merely is used to electrically compensate for the rotating magnetic field. These two elements are connected to the respective inputs of a differential amplifier 18. Constant current sources 20 and 22 provide a constant current through the elements 14 and 16 so that any change in resistance of the element is detected as an output voltage at the inputs to differential amplifier 18 so that amplification may occur.

The output of differential amplifier 18 is connected to notch filter 24 which passes all frequency outputs except those in the "notch" which is tuned to be the same frequency as that of the rotating in plane magnetic field. The output of filter 24 is connected to amplifier 26 which further amplifies the output from the bubble chip. Further, amplifier 26 is responsive to a bias pulse which is amplitude and time adjusted to be of an appropriate duration at the time when a magnetic bubble would be detected, if present, so that the output of amplifier 26 tends to be low at all times other than when a bubble might be detected. A detector circuit 28 is connected to the output of amplifier 26 and described further with respect to FIG. 2. A flip-flop 30 is connected to the output of detector 28 and is responsive to a strobe input on strobe line 32 to produce the final output of the device. The strobe line is activated at the appropriate time when a magnetic bubble, if present, would be detected and is at all other times unactivated.

Figure 2:
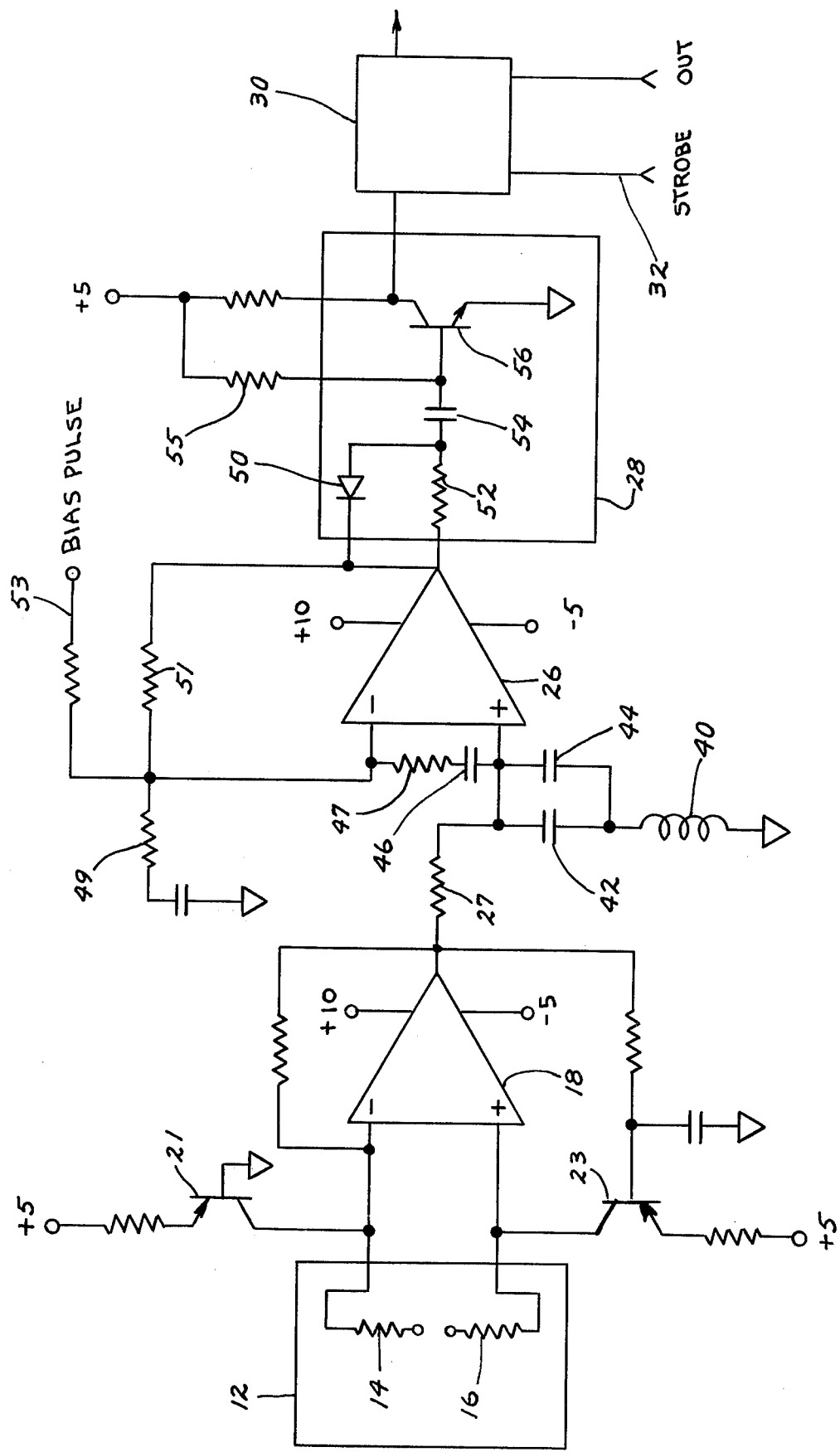
FIG. 2 is a schematic diagram of a circuit according to the present invention and based on the block diagram of FIG. 1.

Referring now to FIG. 2, the bubble memory chip 12 and detector elements 14 and 16 are shown as before. Differential amplifier 18 is shown together with the associated constant current sources provided in this case by transistors 21 and 23 corresponding to constant current sources 20 and 22, respectively, as shown in FIG. 1.

The output of amplifier 18 is connected to differential amplifier 26 through a coupling resistor 27. Filter 24 as shown in FIG. 1 is comprised of inductor 40 and capacitors 42 and 44 on the positive input of the amplifier. Capacitors 42 and 44 together with inductor 40 are tuned to the frequency of the rotating in plane magnetic field.

Obviously a single capacitor may be used instead of the two capacitors shown. Two are shown solely because it might be necessary, for example, to use more than one capacitor in parallel in order to achieve the desired capacitance so that the filter has the desired characteristic. Alternatively, one of the capacitors 40 and 42 might be fixed while the other might be variable. Alternatively, a single fixed capacitor may be used together with a variable inductor in order to provide accurate tuning of a device according to the present invention.

The resistor-capacitor network formed by capacitor 46 and 47 is selected to enhance the second harmonic of the frequency spectrum of the output of the bubble memory device 12 when a magnetic bubble passes the detectors. The combination of capacitor 46 and resistor 47 also tends to suppress the higher harmonics of this output signal. Resistors 49 and 51 control the gain of the amplifier 26 and this gain may be typically selected to be on the order of 20 or 30. A bias pulse is injected at input 53 to amplifier 26 as a further aid to good signal discrimination. This bias pulse is controlled at the fundamental frequency of the bubble memory chip and the amplitude and width of this pulse are adjusted so that amplifier 26 enhances the difference between "ones" and "zeros" in the output signal. The output of differential amplifier 26 is connected to detector 28.

Detector 28 consists of diode 50 and resistor 52 in parallel coupled through capacitor 54 to the base of transistor 56. Transistor 56 operates as the detecting transistor. Transistor 56 is normally in an on-condition as a result of bias current through resistor 55. Positive output signals, resulting from detected magnetic bubbles, from amplifier 26 drive the transistor through resistor 52 and capacitor 54 to a greater current carrying condition or as commonly stated, drive transistor 56 "harder." Any negative going signals from amplifier 26 are coupled through diode 50 and capacitor 54 to tend to turn transistor 56 off. The unsymmetrical coupling caused by the presence of diode 50 to more strongly couple negative signals than positive signals results in the circuit being self-biased such that only comparatively large second harmonic signals caused by the presence of magnetic bubbles are sufficient to cause transistor 56 to be shut off.

The output of transistor 56 is coupled to output flip-flop 30 which assumes the state of the collector of transistor 56 at the time a strobe pulse is applied on strobe line 32. Thus, this strobe pulse flip-flop combination provides time discrimination with respect to the ability to select a time for sampling the output signal when the wave shape for a "one" indicating a magnetic bubble or a "zero" indicating no bubble signals are uniquely different. Between the appropriate times for bubble signals, random signals present in the system would not be so uniquely different. The flip-flop used can be of the type referred to as a transparent latch which holds data until the next strobe pulse is received or it may be of the type known as a set-reset flip-flop.

What is claimed is:

1. A detector-amplifier for bubble memory devices of the type having a dual output, one dummy and one active, comprising:
    a differential amplifier, including a constant current source associated with each input and adapted to be connected with respective outputs of a bubble memory device,
    a notch filter coupled to the output of said differential amplifier and tuned to eliminate signals at the frequency of the rotating magnetic field of a bubble memory device to be associated therewith,
    an amplifier means connected with the output of said notch filter and including means responsive to a bias pulse to increase the gain of said amplifier,
    a self biasing detector coupled to the output of said amplifier means, and
    flip-flop means coupled to the output of said detector and including means responsive to a strobe pulse for gating an output signal.

2. The detector-amplifier of claim 1 wherein said notch filter is comprised of a series tuned capacitor-inductor network connected between the output of said differential amplifier and a ground reference.

3. The detector-amplifier of claim 1 wherein said amplifier means is a differential amplifier and further comprising a series coupled resistor-capacitor network coupled across the inputs thereof to enhance the second harmonic signal of a detected magnetic bubble.

4. The detector-amplifier of claim 1 wherein said self biasing detector is comprised of a resistor and diode in parallel coupled to the output of said amplifier means at one connecting point thereof, a capacitor connected to the other connecting point of the resistor and diode in parallel, said capacitor being connected to an amplifier means and biasing means for said diode.

* * * * *